United States Patent [19]

Mace

[11] 4,215,306
[45] Jul. 29, 1980

[54] ELECTRICAL TESTING APPARATUS

[75] Inventor: Richard W. Mace, Granger, Utah

[73] Assignee: John W. Ramseyer, Granger, Utah; a part interest

[21] Appl. No.: 3,297

[22] Filed: Jan. 15, 1979

[51] Int. Cl.² ............................................. G01R 15/12
[52] U.S. Cl. .................................... 320/2; 324/73 R
[58] Field of Search .................... 324/51, 73, 378, 384; 320/2, 48, 25, 26

[56] References Cited

U.S. PATENT DOCUMENTS

| | | | |
|---|---|---|---|
| 1,429,002 | 9/1922 | Weinberg | 324/73 R |
| 1,433,488 | 10/1922 | Smith | 324/73 R |
| 1,482,714 | 2/1924 | Stillger | 324/73 R |
| 2,535,279 | 12/1950 | Folk | 324/73 R |
| 2,659,042 | 10/1953 | Anderson et al. | 320/2 |
| 3,424,979 | 1/1969 | Stocker | 324/384 X |
| 3,638,108 | 1/1972 | Channing | 324/73 R X |

Primary Examiner—Robert J. Hickey
Attorney, Agent, or Firm—Criddle & Western

[57] ABSTRACT

Apparatus for analyzing operation of the electrical supply system of an automobile and for starting an automobile having a discharged battery comprises a battery mounted on a mobile cart. A jumper cable is attached to one of the terminals of the battery. A relay switch having a pair of normally open contacts is provided, with one of the contacts connected to the other terminal of the battery. A second jumper cable is attached to the other contact of the relay switch. The jumper cables are adapted to be attached to the respective terminals of the discharged battery in the automobile being serviced. Circuit means are provided for selectively energizing the coil of the relay switch and thereby completing the connection between the second jumper cable and the battery on the cart. The circuit means also includes a first test probe connected in series with a switch to the battery, whereby the first test probe can be selectively energized for testing electrical components of the automobile being serviced as well as providing electrical energy to the ignition of such automobile. A second test probe is connected to the circuitry which energizes the coil of the relay switch, so that the second test probe is energized whenever the coil of the relay switch is energized. The second test probe can be used for testing electrical components of the automobile being serviced as well as providing electrical energy directly to the starter of such automobile.

16 Claims, 2 Drawing Figures

ELECTRICAL TESTING APPARATUS

BACKGROUND OF THE INVENTION

1. Field

The invention pertains to apparatus for testing various parts of the electrical system of an automobile and for starting an automobile having a discharged battery.

2. State of the Art

Voltage meters, amp meters, and continuity testers are all conventionally used in testing portions of the electrical system of an automobile. Heretofore, these instruments were generally used independently of each other. These instruments are of limited uitility in and of themselves in checking the electrical system of a stalled automobile which has a dead battery. The instruments, of course, are not at all adapted to aid in starting such a stalled automobile.

OBJECTIVES

A principle objective of the present invention is to provide a portable, or otherwise mobile, apparatus which carries its own independent supply of electrical power and is readily connected to a discharged battery in an automobile for starting such automobile and checking the electrical charging and supply system thereof for indications of possible problems other than simply a discharged battery. An additional objective is to provide such anapparatus which is further adapted to analyze operation of specific components of the electrical system of the automobile, such as electrical motors used in the heater fan and windshield wipers, etc. A further objective is to provide apparatus which can be controlled from outside the automobile being serviced to start the automobile or to turn the engine of the automobile over without starting the engine. The latter capability is advantageously used in such operations as checking the compression of the cylinders of the engine.

SUMMARY OF THE INVENTION

The above objectives are achieved in accordance with the present invention by apparatus including a mobile cart on which a battery is mounted. A jumper cable is attached at one of its ends to one of the terminals of the battery, and means are provided on the other end of the jumper cable for attachment to the corresponding terminal of the discharged battery in the automobile which is being serviced. A relay switch, having a pair of normally open contacts, is mounted on the cart, with one of the pair of normally open contacts connected to the other terminal of the battery which is on the cart. A second jumper cable is attached at one of its ends to the other contact of the relay switch, with means on the other end of the second jumper cable for attachment to the other terminal of the discharged battery in the automobile which is being serviced.

A first circuit is provided comprising a switch and a resistor connected in series between the other terminal of the battery on the cart and a first test probe. In a modified embodiment of the invention a switch shunts the resistor in the first circuit.

A second circuit is included in the apparatus and comprises a switch and the coil of the relay switch connected in series between the other terminal of the battery on the cart and ground potential. A shunt switch is connected in parallel with the switch in the second circuit, and a second test probe is connected to the second circuit between the switch and the coil in that circuit.

The mobile cart is peferably made of an electrically conductive material such as iron or steel, with an electrical conductor connecting the one terminal of the battery of the apparatus to the cart. Battery charging means can be mounted on the cart and connected by respective lead conductors to the battery on the cart. Such charging means is adapted to be connected to a conventional source of alternating current and to supply a direct current to the battery on the cart.

BRIEF DESCRIPTION OF THE DRAWINGS

A particular embodiment of the present invention presently contemplated as representing the best mode of carrying out the invention is illustrated in the accompanying drawings in which.

DETAILED DESCRIPTION OF THE ILLUSTRATED EMBODIMENT

Figure 1:
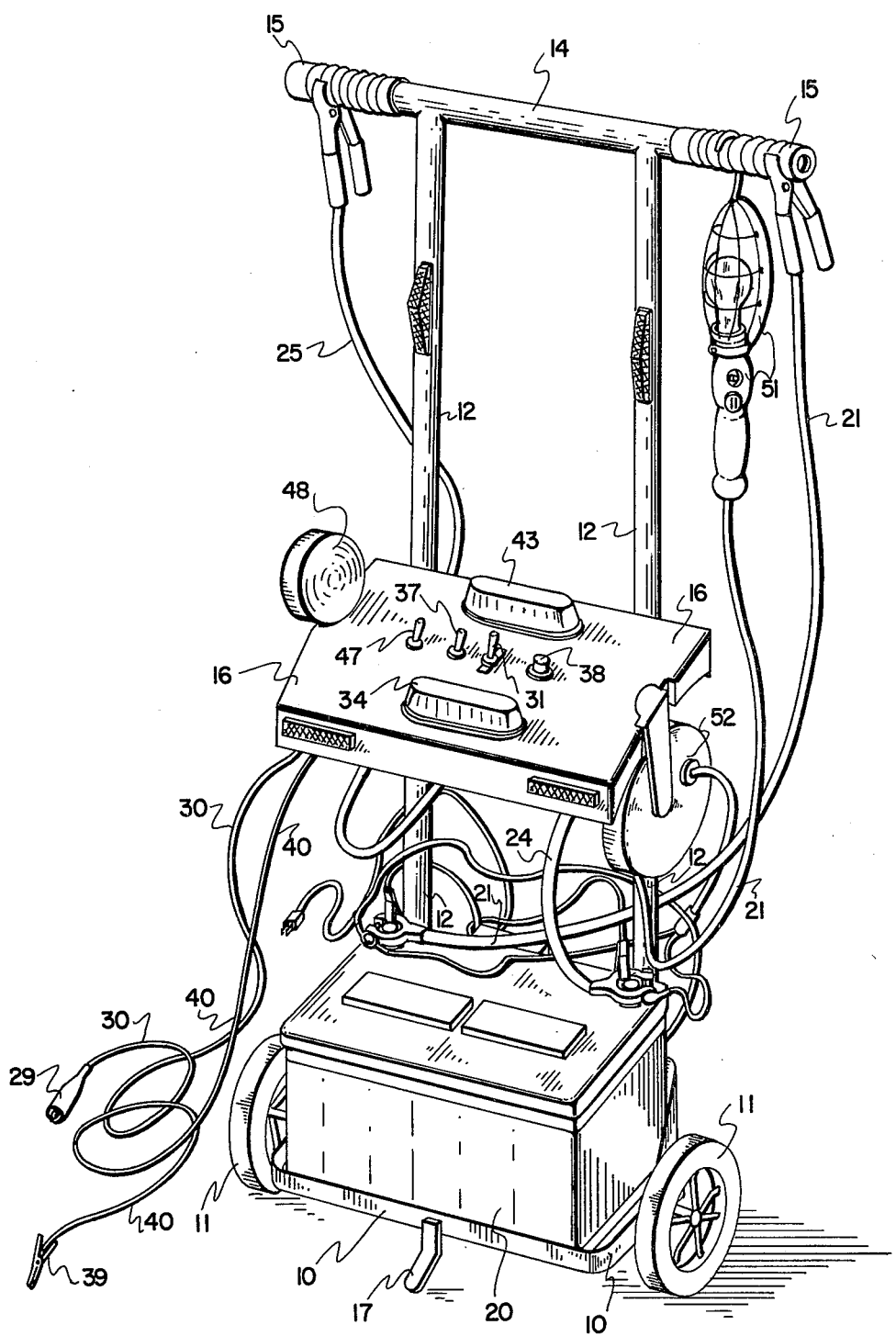
FIG. 1 is a perspective view of one preferred embodiment of the apparatus of this invention.

As illustrated in FIG. 1, the apparatus of this invention includes a mobile cart including a base platform 10 which has two wheels 11 rotatably mounted thereon. A pair of upstanding elongate members 12 are connected to the back of the base platform 10 and extend substantially in parallel with each other to a cross bar 14 which forms handles 15 at its opposite ends. The handles 15 are preferably covered by a nonconducting material such as rubber or plastic.

A control panel 16 is attached to the elongate members 12, and various electrical components which are more fully discussed hereinafter are mounted on the control panel 16. The base platform 10 has a stabilizer foot 17 attached to the front side thereof, so that the cart will stand upright supported by the wheels 11 and foot 17. The cart is easily moved from one place to another by grasping the handles 15, tilting the cart backwards slightly to lift the foot member 17 from the ground, and then pushing the cart forward or pulling the cart backward on its wheels 11.

Figure 2:
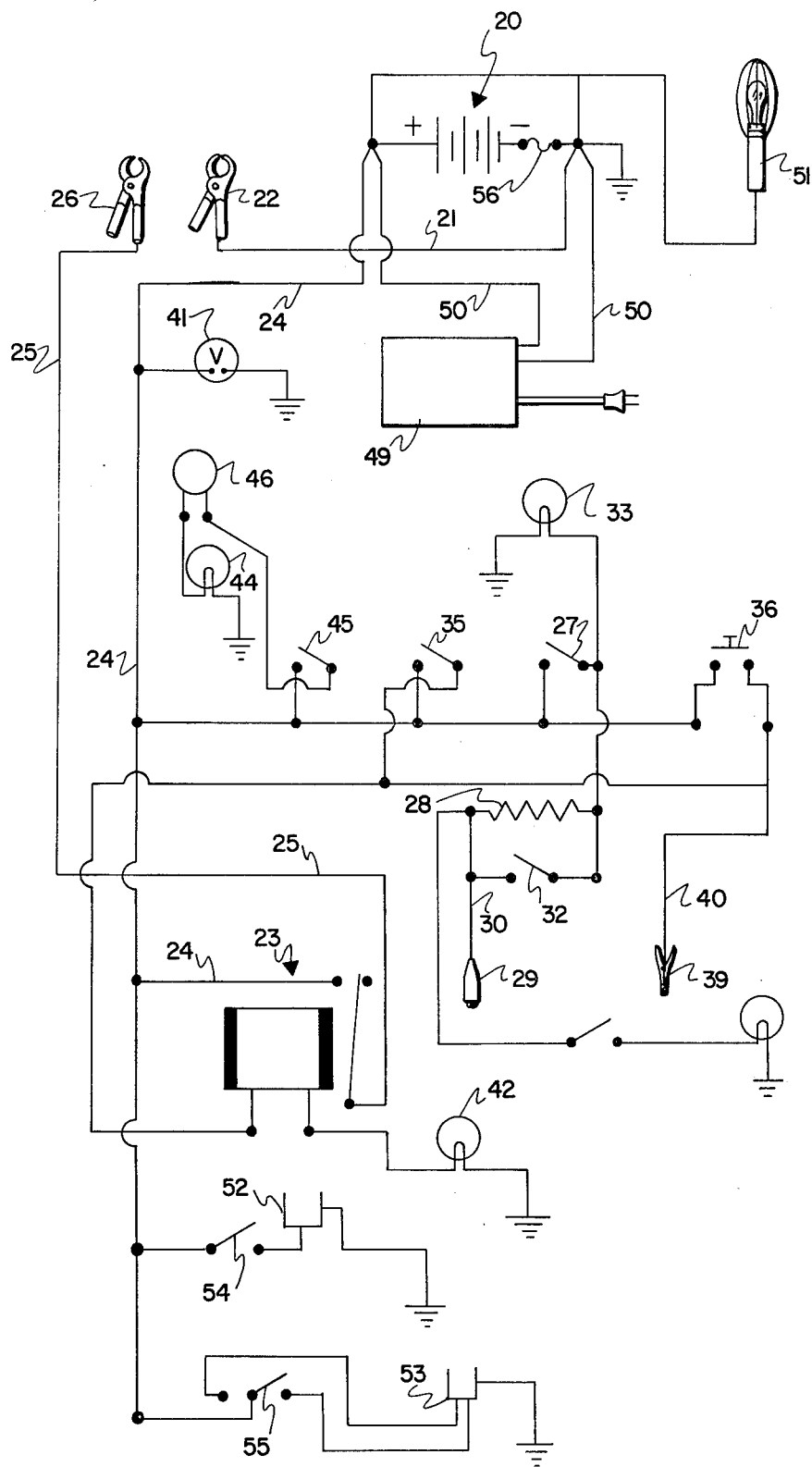
FIG. 2 is a schematic diagram of the circuitry of the apparatus in FIG. 1.

The circuitry of the apparatus is shown diagramatically in FIG. 2. Components of the circuitry which appear in both FIGS. 1 and 2 are identified by like reference numerals. The circuitry includes a battery 20 which is mounted on the base platform 10 of the cart. A jumper cable 21 is attached at one of its ends to one of the terminals of the battery. As illustrated, the apparatus is set up so as to be compatible with a negative ground system such as is utilized on most of the automobiles made worldwide. Thus, the one end of jumper cable 21 is shown attached to the negative terminal of the battery. If the apparatus is to be used for a positive ground system, the connections to the terminals as shown in FIG. 2 are reversed.

The other end of jumper cable 21 is provided with means for attachment to the discharged battery in the automobile which is being serviced. As illustrated, a heavy duty clamp 22 is connected to the other end of the jumper cable 21. For the conventional negative ground system, the clamp 22 would be connected to the corresponding negative terminal of the discharged battery in the disabled automobile.

One contact of a relay switch 23 (not visible in FIG. 1) having a pair of normally open contacts is connected by cable 24 to the positive terminal of the battery 20. A second jumper cable 25 is attached at one of its ends to the other contact on the relay switch 23, with the other end of the jumper cable 25 being provided with means for attachment to the discharged battery in the disabled vehicle. As illustrated, a heavy duty clamp 26 is connected to the other end of the jumper cable 25.

A first circuit is provided comprising a switch 27 and a resistor 28 (not visible in FIG. 1) connected in series between the positive terminal of the battery 20 and a first test probe 29. As shown, the test probe 29 comprises an insulated alligator clip at the end of a wire 30 which is connected to the resistor 28. The switch 27 is mounted on the underside of panel 16 of the apparatus, and as shown in FIG. 1, the operating toggle handle 31 of switch 27 extends upwardly from the upper face of panel 16. An optional switch 32 (not shown in FIG. 1) shunts the resistor in the first circuit. The first test probe 29 of the first circuit is useful in checking the operation of various electrical components of the automobile which is being serviced. It can advantageously be connected to the ignition system of a disabled automobile when attempting to start the automobile, or it can be attached to various components such as motors, lights, etc., to see if such components are operable. If the resistor 28 in the first circuit is not shunted by switch 32, then the utility of the first probe is limited to that of being connected to the ignition system of a disabled automobile which is to be started and checked out, wherein the automobile which is being serviced has a conventional ignition system. To check the ignition of an automobile having a transistorized ignition system, or an electrical component of the automobile, such as its heater fan, the resistor 28 must be removed from the first circuit so that a full 12 volts is applied to the transistorized ignition or the electrical component which is being checked. Advantageously, the switch 32 is provided so that the resistor can in effect be removed from the first circuit by closing switch 32. When equipped with both the resistor 28 and the switch 32, the apparatus is adaptable to checking the ignition of either the conventional or transistorized ignition systems of various automobiles. The resistor 28 has a sufficient resistance to result in a voltage drop of about 3 volts across the resistor when probe 29 is connected to the coil of the ignition system of the automobile having a conventional non-transistorized ignition system. In place of the resistor 28, a solid state voltage control device, such as a zener diode or other control system, could be used which controls the voltage to probe 29 to a value of about 9 volts. A lamp 33 is advantageously connected between ground potential and the first circuit, so that current will flow through and light the lamp 33 when switch 27 is closed. As shown in FIG. 2, the lamp 33 is connected between the switch 27 and ground, such that when switch 27 is closed, the lamp 33 will light, giving visual notice that the test probe 29 is energized. The lamp 33 is preferably mounted on the panel 16, with a protective lens cap 34 (FIG. 1) enclosing the lamp 33. Various color lens caps can be used so as to emit a particular color when the lamp 33 is lit. With clamps 22 and 26 connected to the appropriate terminals of the battery of the automobile under test and with switch 27 open and switch 32 preferably closed (switch 32 can, however, be left open), probe 29 can be used to test continuity in selected circuits, wiring, or components of an automobile. If continuity exists in the wiring, circuit, or component being tested, the lamp 33 will light. If there is no continuity, lamp 33 will remain unlit. Probes 29 and 39 (probe 39 is more fully described heeinafter) can also be used for continuity checking of wiring or electrical components without the need of connecting clamps 22 and 26 to the battery of the automobile under test. Switch 27 is left open and probes 29 and 39 are connected across the wire or component which is to be tested. Switch 36 is then closed, and if continuity exists in the wire or component connected between probes 29 and 39, lamp 33 will light. If there is no continuity, lamp 33 will remain unlit.

A second circuit is provided comprising a switch 35 connected in series with the coil of the relay switch 23 between the positive terminal of the battery 20 and ground potential. A shunt switch 36 is connected in parallel with the switch 35 in the second circuit. Switches 35 and 36 are preferably mounted on the underneath side of panel 16 so as to not be visible per se in FIG. 1. Switch 35 is a conventional toggle switch with the toggle handle 37 extending upward from panel 16 as shown in FIG. 1. Shunt switch 36 is preferably a push button switch, and the push button 38 of that switch is shown mounted the panel 16 in FIG. 1. As best shown in FIG. 2, a second probe 39 is connected to the second circuit between the switch 35 and the coil of the relay switch 23. A cable 40 is connected at one of its ends to the second probe 39 and at its other end to the second circuit. The second probe 39 is preferably an alligator clip.

The second probe 39 is adapted to be connected directly to the starter motor of a disabled automobile which is being serviced. The clamps 22 and 26 are attached to the corresponding terminals of the battery in the disabled automobile. The motor of the disabled vehicle can now be turned over without manipulation of the keys inside the vehicle. By pressing the button 38 of the shunt switch 36, electrical energy is supplied from the battery 20 to the starter of the disabled vehicle through cable 40 and the second probe 39. The relay switch 23 also closes, thereby connecting the battery in the disabled vehicle in parallel connection with the battery 20 of the present apparatus. Once the engine starts, the shunt switch 36 is released so as to disconnect the second probe 39 from the battery 20 and also to reopen the relay switch 23. If the disabled vehicle will not start, the first probe 29 is connected to the coil of the ignition system of the disabled vehicle. Switch 27 is closed and the button 38 on the shunt switch 36 is pushed in an attempt to start the car. If the disabled vehicle starts and runs, it then appears that a bad connection or short occurs in the wiring supplying electrical current to the coil. If the disabled vehicle still refuses to start, then the coil and distributor portions of the ignition system become highly suspect as the cause of the failure.

In the peferred embodiment as illustrated in the drawings, a voltmeter 41 (not shown in FIG. 1) is connected between the positive terminal of the battery 20 and ground. If the alternator system of the disabled vehicle is not working, once the motor in the disabled vehicle is started, the voltmeter will read some value of 12 or less volts. If the alternator system of the disabled vehicle is functioning properly, the voltage reading on meter 41 will be greater than 12 volts, i.e., up to about 14 to 16 volts.

In those instances wherein the only problem existing in the disabled vehicle is a discharged battery, the vehicle can be started using the ignition switch within the automobile itself, by connecting the clamps 22 and 26 to the discharged battery, closing switch 35, and turning the key inside the disabled automobile.

The second probe 39 is handy in checking for other electrical components, such as motors, lights, etc. When switch 35 is closed, second probe 39 is energized and can be connected to the component under test to see if the component operates. If the component does operate, then there is a short or break somewhere in the wiring leading to that particular electrical component, and as mentioned hereinbefore, the second probe 39 can be advantageously used together with the first probe 29 in checking wiring and electrical components for continuity. In addition, second probe 39 is advantageously used when the compression of the cylinders in the automobile under test is being checked. The clamps 22 and 26 are connected to the battery in the automobile, and second probe 39 is connected directly to the starter engine of the automobile. When switch 35 is closed, the engine of the automobile will be continuously turned over without any chance of the engine starting. The individual cylinders of the engine can then be checked one at a time, and after all the cylinders have been checked, switch 35 is opened so as to de-energize the starter motor.

A Lamp 42 is advantageously provided in combination with the second circuit and the shunt switch 36, so that current will flow through and light lamp 42 when either the switch 35 in the second circuit or the shunt switch 36 is closed. As illustrated in FIG. 2, the lamp 42 can be connected in series with the coil of the relay switch 23 and ground potential. The lamp is advantageously mounted in the panel 16, with a protective lens cap 43 (FIG. 1) enclosing the lamp 42. When lamp 42 lights, the lens cap 43 will emit a particular color corresponding to the color of the lens cap and visually indicate that either switch 35 or shunt switch 36 is closed.

A highway warning lamp 44 is advantageously employed on the apparatus to provide a flashing light when the apparatus is being used to service a disabled automobile on or near a highway or street. The lamp 44 is included in a third circuit which comprises a switch 45, a flasher unit 46, and the lamp 44 connected in series between the positive terminal of the battery and ground potential. The switch 45 is mounted on the panel 16, and the toggle handle 47 of such switch 45 is shown extending from panel 16 in FIG. 1. The lamp 44 is conveniently housed in a light assembly 48 (FIG. 1) which is attached to the panel 16. The lens of the light assembly can be either red or amber so as to provide a proper flashing signal when switch 45 is closed.

A battery charging means can be included in the apparatus which is adapted to be plugged into an alternating current source and, thus, charge the battery 20 when the apparatus is not in use. A conventional charging device 49 which is adapted to convert alternating current to direct current is connected by lead conductors 50 to the terminals of the battery 20. When the battery charger 49 is plugged into a source of alternating current, the alternating current is converted to direct current and supplied to the battery 20 at a proper charging voltage through the lead conductors 50.

A trouble light can also be provided on the apparatus to illuminate the area around the apparatus and disabled vehicle when there is insufficient daylight. A conventional trouble light 51 which is adapted to operate on 12 volts is connected to the battery 20. The trouble light 51 generally will have a built in switch for turning the light on and off. However, the light could be wired to a switch (not shown in the drawings) on the panel 16 similar to switches 27, 35 and 45, whereby the trouble light could be turned on and off from the panel 16. A cord windup means 52 is advantageously attached to the apparatus, such as to the panel 16 as shown in FIG. 1. The cord windup means 52 is adapted to store the cord 53 from the trouble light 51 on a reel in the windup device. When the trouble light 51 is to be used, the cord 53 is withdrawn from the reel in the windup device 52, and, conversely, when the trouble light 51 is no longer being used, the cord 53 is automatically rewound and stored on the reel in the windup device 52.

Test receptacles or sockets can also advantageously be included in the apparatus for testing tail lights bulbs, etc. As shown in FIG. 2, a pair of sockets 52 and 53 are connected between a source of voltage and ground potential. As illustrated, socket 52 is adapted to receive a single filament bulb, such as used in running lights, backup lights, etc. The socket 52 is connected in series with a switch 54 between conductor 24 and ground. In testing a lamp bulb, it is placed in the socket 52 and switch 54 closed. If the lamp bulb is good, it will light. The second socket 53 is advantageously adapted to test lamp bulbs having two filaments, such as the tail and brake light lamp. Each filament post of the socket 53 is connected to a respective pole of a double throw switch 55, and the switch is, in turn, connected to the conductor 24. The ground connection of socket 53 is connected to ground potential. In testing a double filament lamp bulb, the lamp bulb is inserted into the socket 53, and the switch 55 is thrown one way to test one filament of the bulb and then thrown the other way to test the second filament. If the bulb is good, the respective filaments will light each time the switch is thrown. The switches 52 and 54 can conveniently be mounted on panel 16, as can the sockets 52 and 53. It has been found advantageous to also mount the sockets in the ends of the handle sections 15 of the device, with wiring to the sockets running through the handles.

The apparatus of this invention can further be provided with means for quickly and easily determining if a continuity exists in the windings of a motor of if a lamp housing or other electrical component of an automoble under test is properly grounded. Such means comprises a lamp 56 connected between probe 29 and ground as shown in FIG. 2. Preferably, a switch 57 is included in series with the lamp 56. In using the test lamp 56, switch 32 shunting resistor 28 is opened, and if switch 57 is included in series with lamp 56, it is closed. The clamp 22 is attached to the negative or grounded terminal of the automobile under test or to a ground portion of the body of the automobile and probe 29 is connected to the electrical lead of the motor that isto be tested, or probe 29 is attached to the lamp housing or other component which is to be tested to determine if it is properly grounded. If a motor is being tested to determine the continuity of the motor winding, lamp 56 will turn off if the motor winding is in proper operating condition. If a discontinuity exists in the motor winding, lamp 56 will remain lighted. In testing a lamp housing or other component to determine if it is properly grounded, the light 56 will turn off if the housing or component is grounded. If lamp 56 remains lighted, the lamp housing or other component is not properly grounded.

To prevent overheating or burning out of any of the components or wires of the apparatus in those instances wherein the clamps 22 and 26 are attached to the wrong posts of the battery in the automobile being serviced, a current limiting device, such as a fuse 56 or circuit breaker is included in the ground conductor connecting the one negative terminal of the battery 20 to the ground potential. The fuse 56 also protects against any direct shorts which may inadvertently occur if either of the first and second probes when energized contacts ground potential.

Whereas this invention is specifically illustrated and described with an embodiment that represents the best mode presently contemplated of carrying out the invention, it should be understood that other embodiments and various modifications can be achieved in accordance with the teachings hereof without departing from the subject matter coming within the scope of the accompanying claims, which subject matter is regarded as the invention.

I claim:

1. Apparatus for analyzing operation of the electrical supply system of an automobile and for starting an automobile having a discharged battery, said apparatus comprising:
    a mobile cart;
    a battery mounted on said cart;
    a jumper cable attached at one end thereof to one of the terminals of the battery, with means on the other end of said jumper cable for attachment to the corresponding terminal of the discharged battery in said automobile;
    a relay switch, having a pair of normally open contacts, with one of its contacts connected to the other terminal of said battery on said cart;
    a second jumper cable attached at one end thereof to the other contact of said relay switch with means on the other end of said second jumper cable for attachment to the other terminal of the discharged battery in said automobile;
    a first circuit comprising a switch and a resistor connected in series between said other terminal of said battery and a first test probe;
    a second circuit comprising a switch and the coil of said relay switch connected in series between said other terminal of said battery and ground potential;
    a shunt switch connected in parallel with the switch in said second circuit; and
    a second test probe connected to said second circuit between the switch and coil in said second circuit.

2. Apparatus in accordance with claim 1, wherein the mobile cart is made of an electrically conductive material, and an electrical conductor connects said one terminal of the battery to the cart.

3. Apparatus in accordance with claim 1, further including a third circuit comprising a switch, flasher unit, and lamp connected in series between said other terminal of the battery and ground potential.

4. Apparatus in accordance with claim 1, wherein a lamp is connected between ground potential and the first circuit so that current will flow through and light the lamp when the switch in the first circuit is closed.

5. Apparatus in accordance with claim 1, wherein a lamp is provided in combination with the second circuit and the shunt switch, whereby current will flow through and light the lamp when either the switch in the second circuit is closed or the shunt switch is closed.

6. Apparatus in accordance with claim 1, wherein a switch shunts the resistor in the first circuit.

7. Apparatus in accordance with claim 1, wherein means are provided for measuring a voltage across the terminals of the battery on said cart.

8. Apparatus in accordance with claim 1, wherein battery charging means is provided which has lead conductors connected to the respective terminals of the battery on said cart, said charging means being adapted to be connected to a conventional source of alternating current and to supply a direct current to the battery on said cart through said lead conductors.

9. Apparatus in accordance with claim 1, wherein the mobile cart is made of an electrically conductive material and the apparatus further comprises:
    an electrical conductor connecting said other terminal of the battery to the cart;
    a first lamp is provided with means for lighting said first lamp by passing a current therethrough when the switch in the first circuit is closed;
    a second lamp is provided with means for lighting said second lamp by passing a current therethrough when either the switch in the second circuit or the shunt switch is closed;
    a switch shunts the resistor in the first circuit;
    means are provided for measuring the voltage across the terminals of the battery; and
    battery charging means are provided having lead conductors connected to the respective terminals on the battery, said charging means being adapted to be connected to a conventional source of alternating current and to supply direct current to said battery through said lead conductors.

10. Apparatus in accordance with claim 9, further including a third circuit comprising a switch, flasher unit, and lamp connected in series between said one terminal of the battery and ground.

11. Apparatus in accordance with claim 9, further including a trouble light connected by a length of electrical cable to the battery on said cart.

12. Apparatus in accordance with claim 11, wherein windup means are provided for storing the electrical cable to the trouble light.

13. Apparatus in accordance with claim 1, further including at least one socket or receptacle adapted to receive a lamp bulb of the type used as running lights, brake lights, and backup lights on an automobile, said socket being connected between said other terminal of the battery and ground potential.

14. Apparatus in accordance with claim 13, wherein a switch is connected in series with said socket between said other terminal of the battery and ground potential.

15. Apparatus in accordance with claim 1, wherein a test lamp is connected between ground and a point in said first circuit between said resistor and said first test probe.

16. Apparatus in accordance with claim 15, wherein a switch is included in series with said test lamp.

* * * * *